(12) United States Patent
Mori

(10) Patent No.: US 11,513,546 B2
(45) Date of Patent: Nov. 29, 2022

(54) CURRENT GENERATION CIRCUIT, DRIVE CIRCUIT, AND CURRENT ADJUSTMENT METHOD

(71) Applicant: FUJI ELECTRIC CO., LTD., Kawasaki (JP)

(72) Inventor: Takahiro Mori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/412,987

(22) Filed: Aug. 26, 2021

(65) Prior Publication Data

US 2021/0389788 A1    Dec. 16, 2021

Related U.S. Application Data

(63) Continuation of application No. PCT/JP2020/033616, filed on Sep. 4, 2020.

(30) Foreign Application Priority Data

Sep. 11, 2019    (JP) .............................. JP2019-165321

(51) Int. Cl.
*G05F 1/56*      (2006.01)
*H03K 17/687*    (2006.01)

(52) U.S. Cl.
CPC ........... *G05F 1/56* (2013.01); *H03K 17/6872* (2013.01)

(58) Field of Classification Search
None
See application file for complete search history.

(56) References Cited

U.S. PATENT DOCUMENTS

| 4,819,117 A | * | 4/1989 | Brennan | ................ | H02H 1/043 |
| | | | | | 361/89 |
| 4,945,445 A | * | 7/1990 | Schmerda | ............... | H01L 24/48 |
| | | | | | 324/123 C |
| 8,035,366 B2 | * | 10/2011 | Kato | ..................... | H02M 3/157 |
| | | | | | 323/283 |
| 8,130,029 B2 | * | 3/2012 | Kinsella | ............... | H03K 17/063 |
| | | | | | 327/543 |
| 8,258,763 B2 | * | 9/2012 | Nakamura | .............. | H02M 1/32 |
| | | | | | 323/299 |

(Continued)

FOREIGN PATENT DOCUMENTS

JP        S57203115 A     12/1982
JP    2012157137 A      8/2012

(Continued)

OTHER PUBLICATIONS

International Search Report for PCT/JP2020/033616, dated Nov. 17, 2020.

(Continued)

*Primary Examiner* — Thomas J. Hiltunen
(74) *Attorney, Agent, or Firm* — Rabin & Berdo, P.C.

(57) ABSTRACT

A current generation circuit includes a metal-oxide-semiconductor (MOS) transistor having a source terminal coupled to one line of a power supply line and a ground line, a voltage generation circuit configured to generate a first voltage corresponding to a resistance value of wiring between the one line and the source terminal, and a control circuit configured to cause the MOS transistor to generate a predetermined current based on the first voltage.

10 Claims, 13 Drawing Sheets

(56) References Cited

U.S. PATENT DOCUMENTS

| | | | |
|---|---|---|---|
| 8,351,175 B2 * | 1/2013 | Ohshima | H02H 3/08 |
| | | | 361/93.1 |
| 8,783,816 B2 * | 7/2014 | Masuda | B41J 2/04563 |
| | | | 347/17 |
| 9,735,767 B2 * | 8/2017 | Watanabe | H03K 17/08 |
| 9,780,772 B2 * | 10/2017 | Lee | H03K 17/0822 |
| 10,263,612 B2 * | 4/2019 | Hayashiguchi | H02H 3/202 |
| 10,340,683 B2 * | 7/2019 | Murakami | H02H 7/205 |
| 10,756,728 B2 * | 8/2020 | Mori | H03K 17/04206 |
| 2012/0188001 A1 | 7/2012 | Mizobe | |
| 2012/0194947 A1 | 8/2012 | Nakashimo | |
| 2014/0139245 A1 | 5/2014 | Hirata | |
| 2017/0093145 A1 | 3/2017 | Nate | |
| 2019/0173463 A1 | 6/2019 | Mori | |
| 2021/0190842 A1 * | 6/2021 | Easton | G02B 7/02 |

FOREIGN PATENT DOCUMENTS

| | | |
|---|---|---|
| JP | 2012159870 A | 8/2012 |
| JP | 2013-098243 A | 5/2013 |
| JP | 2013-219633 A | 10/2013 |
| JP | 2014-098673 A | 5/2014 |
| JP | 2016-052197 A | 4/2016 |
| JP | 2017070028 A | 4/2017 |
| JP | 2018-064339 A | 4/2018 |
| WO | 2017/195864 A1 | 11/2017 |
| WO | 2018/150737 A1 | 8/2018 |

OTHER PUBLICATIONS

Japanese Office Action in the counterpart of Japanese Patent Application No. 2021-545509 dated Oct. 18, 2022.

* cited by examiner

CURRENT GENERATION CIRCUIT, DRIVE CIRCUIT, AND CURRENT ADJUSTMENT METHOD

CROSS-REFERENCE TO RELATED APPLICATIONS

This is a continuation application of International Patent Application No. PCT/JP2020/033616 filed Sep. 4, 2020, which claims the benefit of priority to Japanese Patent Application No. 2019-165321 filed Sep. 11, 2019, the entire contents of each of which the entire contents of each of which are incorporated herein by reference.

BACKGROUND

Technical Field

The present disclosure relates to a semiconductor device.

Description of the Related Art

There are current generation circuits that generate electric currents for driving switching devices (for example, WO 2017/195864).

Incidentally, when a current generation circuit is integrated, a current generated by the current generation circuit may be influenced by wiring resistance depending on, for example, circuit area requirements. As a consequence, the current generation circuit may fail to generate a target current.

The present disclosure is directed to provision of a current generation circuit capable of generating a current with high accuracy.

SUMMARY

A first aspect of the present disclosure is a current generation circuit comprising: a metal-oxide-semiconductor (MOS) transistor having a source terminal coupled to one line of a power supply line and a ground line; a voltage generation circuit configured to generate a first voltage corresponding to a resistance value of wiring between the one line and the source terminal; and a control circuit configured to cause the MOS transistor to generate a predetermined current based on the first voltage.

A second aspect of the present disclosure is a current generation circuit comprising: a plurality of metal-oxide-semiconductor (MOS) transistors each having a source terminal, the source terminal being coupled to one line of a power supply line and a ground line; a voltage generation circuit configured to generate a plurality of first voltages respectively corresponding to the plurality of MOS transistors, each first voltage corresponding to a resistance value of wiring between the one line and the source terminal of one of the MOS transistors corresponding to said each first voltage; and a control circuit configured to cause each of the plurality of MOS transistors to generate a predetermined current based on one of the first voltages corresponding to said each MOS transistor.

An aspect of the present disclosure is a drive circuit configured to turn on a switching device in response to a first signal and to turn off the switching device in response to a second signal, the drive circuit comprising: a p-type metal-oxide-semiconductor (PMOS) transistor having a source terminal coupled to a power supply line; a voltage generation circuit configured to generate a first voltage corresponding to a resistance value of first wiring resistance between the power supply line and the source terminal of the PMOS transistor; a control circuit configured to cause the PMOS transistor to generate a predetermined current for charging a gate capacitance of the switching device based on the first voltage, upon receiving the first signal; and a first n-type metal-oxide-semiconductor (NMOS) transistor having a source terminal coupled to a ground line, the first NMOS transistor being configured to be turned on in response to the second signal to discharge the gate capacitance of the switching device.

An aspect of the present disclosure is a current adjustment method to be performed on a current generation circuit that includes a metal-oxide-semiconductor (MOS) transistor having a source terminal coupled to one line of a power supply line and a ground line, a voltage generation circuit configured to generate a voltage corresponding to a resistance value of wiring between the one line and the source terminal based on a resistance value of a variable resistor circuit, and a control circuit configured to cause the MOS transistor to generate a current based on the voltage of the voltage generation circuit, the current adjustment method comprising: a first step of measuring the current generated by the MOS transistor; and a second step of adjusting the resistance value of the variable resistor circuit, such that the current generated by the MOS transistor becomes equal to a predetermined current.

DETAILED DESCRIPTION

At least following matters will become apparent from the descriptions of the present specification and the accompanying drawings.

Embodiment

Figure 1:
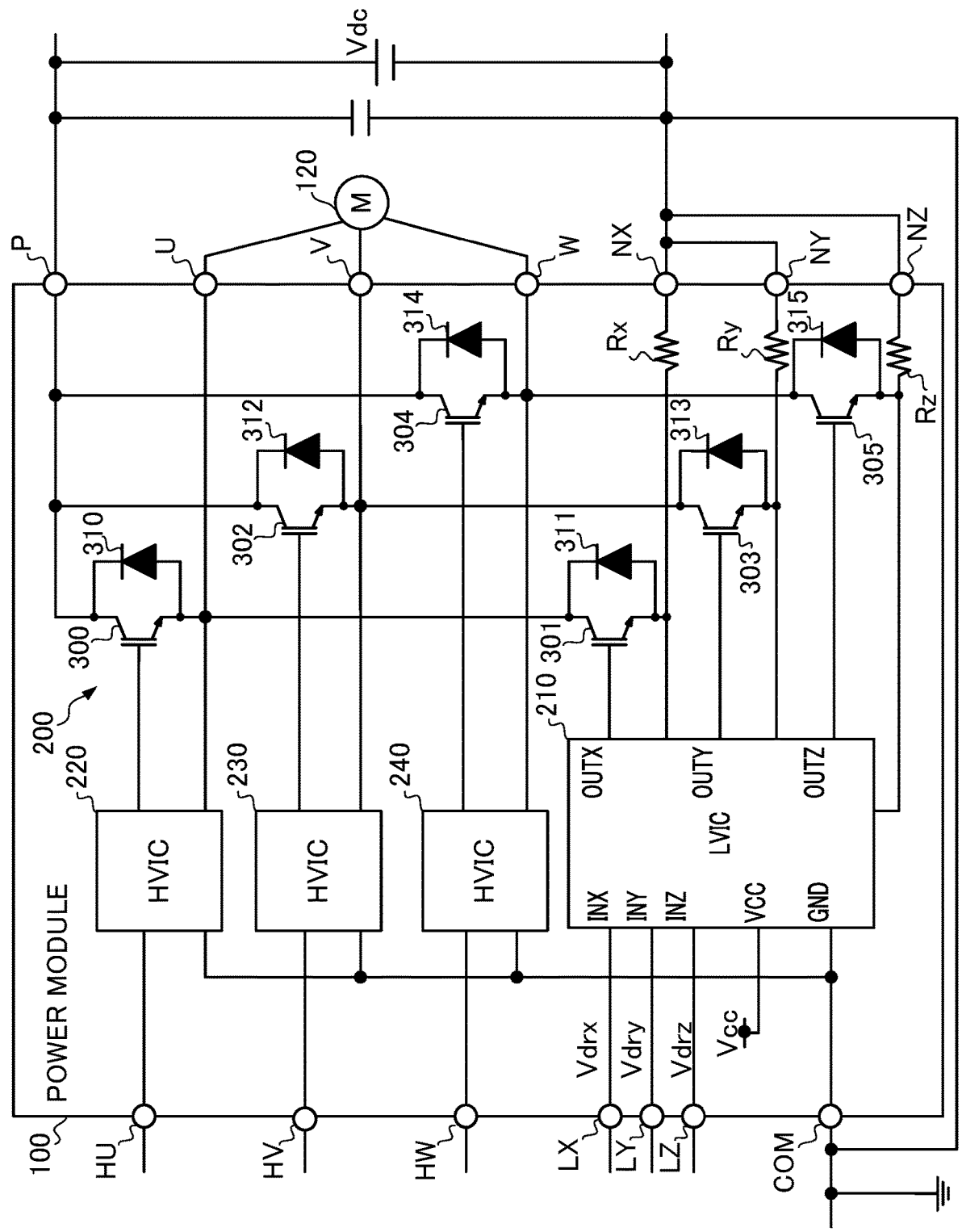
FIG. 1 is a diagram illustrating a configuration of a power module 100.

FIG. 1 is a diagram illustrating a configuration of a power module 100 according to an embodiment of the present disclosure. The power module 100 is a semiconductor device that drives a three-phase motor 120. The power module 100 includes a bridge circuit 200 for power conversion, a Low Voltage Integrated Circuit (LVIC) 210, High Voltage Integrated Circuits (HVICs) 220, 230, and 240, and terminals HU, HV, HW, LX, LY, LZ, P, U, V, W, NX, NY, and NZ.

The bridge circuit 200 includes insulated gate bipolar transistors (IGBTs) 300, 301, 302, 303, 304, and 305 (hereinafter referred to as "IGBTs 300 to 305"), freewheeling diodes (FWDs) 310, 311, 312, 313, 314, and 315, and resistors Rx, Ry, and Rz.

The IGBT 300 is a U-phase switching device while the IGBT 301 is an X-phase switching device. The IGBTs 300 and 301 are provided with the FWDs 310 and 311, respectively.

The IGBT 302 is a V-phase switching device while the IGBT 303 is a Y-phase switching device. The IGBTs 302 and 303 are provided with the FWDs 312 and 313, respectively.

The IGBT 304 is a W-phase switching device while the IGBT 305 is a Z-phase switching device. The IGBTs 304 and 305 are provided with the FWDs 314 and 315, respectively.

Note that, in an embodiment of the present disclosure, the IGBTs 300 to 305 are used as the switching devices in the power module 100, however the switching devices may be, for example, power metal-oxide-semiconductor (MOS) transistors in place thereof.

The resistors Rx, Ry, and Rz detect currents flowing through the X-phase, Y-phase, and Z-phase switching devices, respectively.

A power supply voltage Vdc is applied to the terminal P. The three-phase motor 120 serving as a load is provided to the terminals U, V, and W. The terminals NX, NY, and NZ are grounded.

The HVICs 220, 230, and 240 are integrated circuits for switching the upper-arm IGBTs 300, 302, and 304 in response to the signals from a microcomputer (not illustrated) inputted through the terminals HU, HV, and HW, respectively.

The LVIC 210 is an integrated circuit for switching the lower-arm IGBTs 301, 303, and 305 in response to the drive signals Vdrx, Vdry, and Vdrz from the microcomputer (not illustrated) inputted through the terminals LX, LY, and LZ, respectively.

Figure 2:
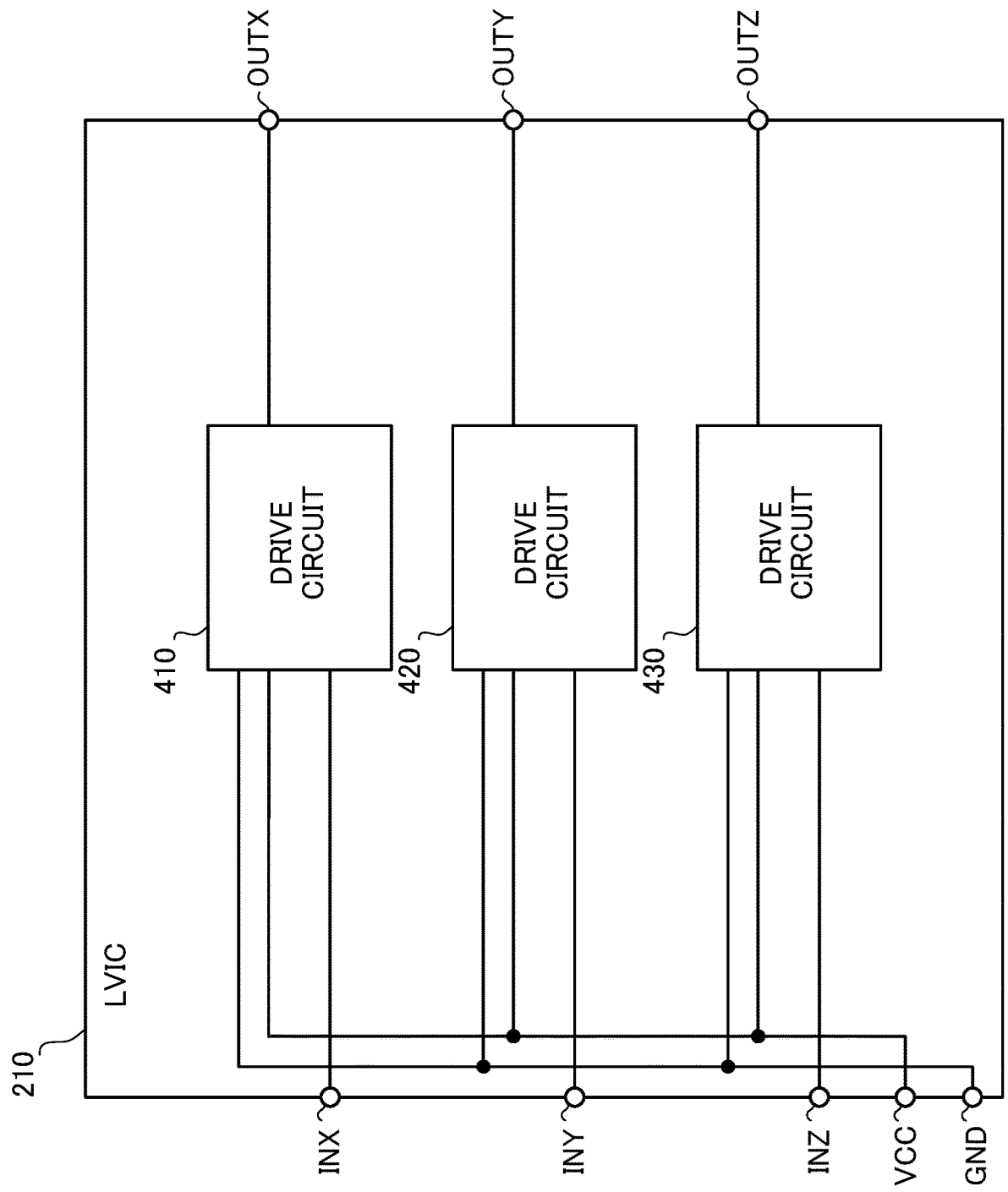
FIG. 2 is a diagram illustrating a configuration of a Low Voltage Integrated Circuit (LVIC) 210.

As illustrated in FIG. 2, the LVIC 210 includes drive circuits 410, 420, and 430 corresponding to the three phases.

<<Configuration of Drive Circuit 410a>>

Figure 3:
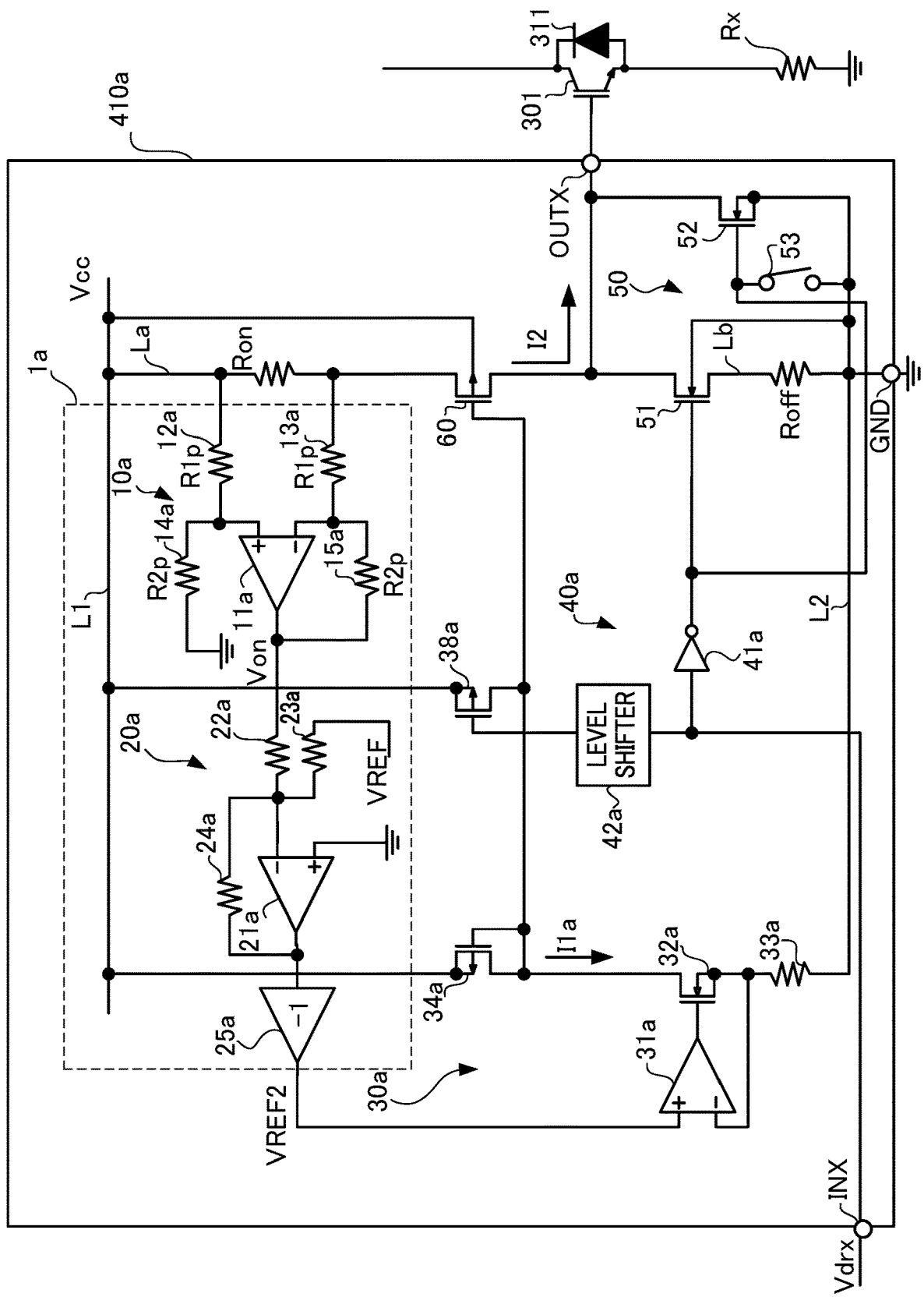
FIG. 3 is a diagram illustrating an example of a configuration of a drive circuit 410*a*.

FIG. 3 is a diagram illustrating an example of a configuration of a drive circuit 410a which represents one embodiment of the drive circuit 410. The drive circuit 410a drives the IGBT 301 by turning on either a p-type metal-oxide-semiconductor (PMOS) transistor 60 or an n-type metal-oxide-semiconductor (NMOS) transistor 51. The drive circuit 410a comprises: a voltage generation circuit 1a that includes a voltage detection circuit 10a and an adder circuit 20a; a control circuit 30a; a switching circuit 40a; a discharge circuit 50; and the PMOS transistor 60.

<<Voltage Generation Circuit 1a>>

The voltage generation circuit 1a generates an adjusted reference voltage VREF2 corresponding to a resistance value of wiring between a power supply line L1 and a source terminal of the PMOS transistor 60.

<<Voltage Detection Circuit 10a>>

The voltage detection circuit 10a generates an adjusted voltage Von corresponding to wiring resistance Ron of wiring La between the power supply line L1 and the source terminal of the PMOS transistor 60. The voltage detection circuit 10a includes an operational amplifier 11a, and variable resistors 12a, 13a, 14a, and 15a (hereinafter referred to as "variable resistors 12a to 15a").

Here, the PMOS transistor 60 is large in size so as to pass a large current for driving the IGBT 301. Thus, the wiring for the PMOS transistor 60 results in being long inside the integrated circuit, and for example, the wiring resistance Ron occurs between the source terminal of the PMOS transistor 60 and the power supply line L1. Meanwhile, a back-gate terminal of the PMOS transistor 60 is coupled to the power supply line L1. Thus, the PMOS transistor 60 has a back-gate effect of raising a threshold voltage of the PMOS transistor 60.

For this reason, even when a gate voltage of the PMOS transistor 60 is a desired voltage, an output current value of the PMOS transistor 60 deviates from a target output current value, depending on the value of the wiring resistance Ron between the source terminal of the PMOS transistor 60 and the power supply line L1.

Accordingly, in an embodiment of the present disclosure, the variable resistors 12a to 15a are provided to reduce an influence of the wiring resistance Ron. Note that the variable resistors 12a to 15a will be described later in detail.

The variable resistor 12a has one end coupled to the wiring La at the immediate vicinity of the power supply line L1 and the variable resistor 13a has one end coupled to the wiring La at the immediate vicinity of the source terminal of the PMOS transistor 60, to detect a voltage drop that may occur between two ends of the wiring resistance Ron. However, in FIG. 3, for ease of understanding, the ends of the variable resistors 12a and 13a are illustrated as if they are located away from the power supply line L1 and the source terminal, respectively.

The variable resistor 12a has the other end coupled to one end of the variable resistor 14a and to a non-inverting input terminal of the operational amplifier 11a. The variable resistor 14a has the other end grounded. The variable resistor 13a has the other end coupled to one end of the variable resistor 15a and to an inverting input terminal of the operational amplifier 11a. The variable resistor 15a has the other end coupled to an output terminal of the operational amplifier 11a.

Meanwhile, the back-gate terminal of the PMOS transistor 60 is coupled to the power supply line L1. A drain terminal of the PMOS transistor 60 is coupled to a terminal OUTX.

As a consequence, the adjusted voltage Von corresponding to the wiring resistance Ron, which is generated by the voltage detection circuit 10a, is given by an expression (1).

$$Von = (R2p/R1p) \times (V2p - V1p) \qquad (1)$$

Where, a resistance value R1p is a resistance value of the variable resistors 12a and 13a, and a resistance value R2p is a resistance value of the variable resistors 14a and 15a. Meanwhile, a voltage V1p is a voltage at a node at which the source terminal of the PMOS transistor 60 and the variable resistor 13a are coupled, and a voltage V2p is a voltage at a node at which the power supply line L1 of the wiring La and the variable resistor 12a are coupled.

Note that the wiring resistance Ron corresponds to "first wiring resistance" and the power supply line L1 corresponds to a "power supply line". Further, the operational amplifier 11a corresponds to a "voltage output circuit", the variable resistors 12a to 15a correspond to a "variable resistor circuit", and the adjusted voltage Von corresponds to a "second voltage".

<<Example of Variable Resistor 12a>>

Figure 4:
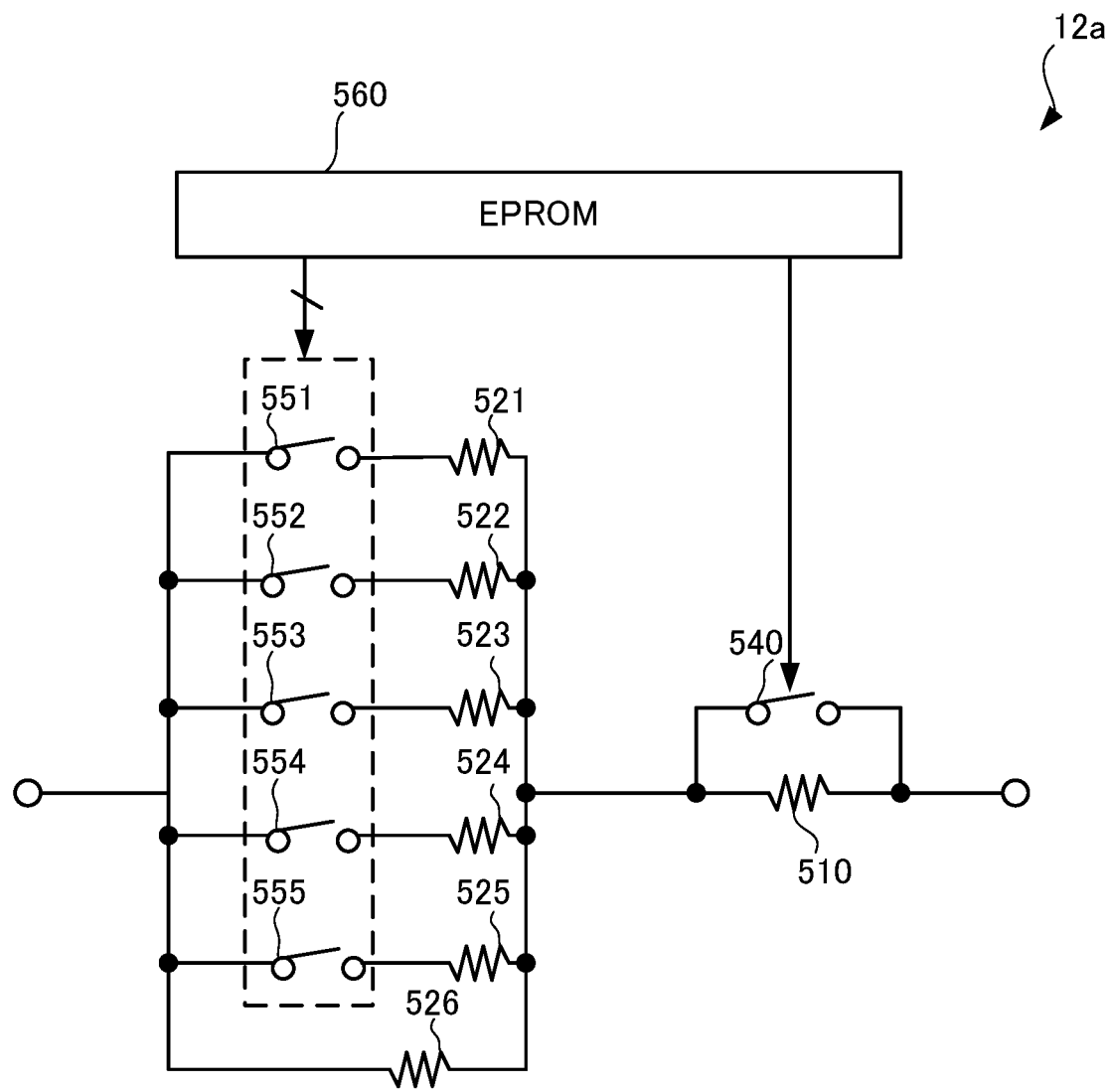
FIG. 4 is a diagram illustrating an example of a variable resistor 12*a*.

FIG. 4 is a diagram illustrating an example of the variable resistor 12a. The variable resistor circuit is a circuit capable of changing its resistance value using built-in switches. Although the variable resistor 12a will be described here, the same applies to the variable resistors 13a to 15a.

The variable resistor 12a includes, for example, resistors 510, 521, 522, 523, 524, 525, and 526 (hereinafter referred to as "resistors 521 to 526"), switches 540, 551, 552, 553, 554, and 555 (hereinafter referred to as "switches 551 to 555"), and an EPROM 560.

In the variable resistor 12a, the resistor 510 has one end serving as an input terminal and the other end coupled to ends on one side of the resistors 521 to 526. Ends on the other side of the resistors 521 to 525 are coupled to ends on one side of the switches 551 to 555, respectively. Further, ends on the other side of the switches 551 to 555 and the other end of the resistor 526 are coupled to an output terminal of the variable resistor 12a.

Further, the switch 540 is coupled between the one end and the other end of the resistor 510. The resistor 526 is coupled in series with the resistor 510 between the input terminal and the output terminal.

The switches 540 and 551 to 555 each are configured, for example, with a MOS transistor. Thus, on and off of the switches 540 and 551 to 555 are set according to data stored in the EPROM 560 at the time of a wafer test.

In an embodiment of the present disclosure, the switches are used as elements to configure the variable resistor 12a. However, the present disclosure is not limited thereto. For example, a Zener diode that enables Zener zapping or a polysilicon fuse that enables laser trimming may be used to implement the variable resistor.

<<Adder Circuit 20a>>

The adder circuit 20a adds the adjusted voltage Von and a predetermined reference voltage VREF to generate the reference voltage VREF2. The adder circuit 20a includes an operational amplifier 21a, resistors 22a, 23a, and 24a (hereinafter referred to as "resistors 22a to 24a"), and an inverting amplifier 25a. Although details will be described later, the adjusted voltage Von is previously adjusted such that the PMOS transistor 60 can generate a current of a desired value.

The resistor 22a has one end coupled to the output terminal of the operational amplifier 11a and the other end coupled to an inverting input terminal of the operational amplifier 21a. The resistor 23a has one end to which the reference voltage VREF is applied and the other end coupled to the inverting input terminal of the operational amplifier 21a. The resistor 24a has one end coupled to the inverting input terminal of the operational amplifier 21a and the other end coupled to an output terminal of the operational amplifier 21a. Further, a non-inverting input terminal of the operational amplifier 21a is grounded. Moreover, the output terminal of the operational amplifier 21a is coupled to the inverting amplifier 25a. The inverting amplifier 25a outputs the adjusted reference voltage VREF2.

Meanwhile, in an embodiment of the present disclosure, since resistance values R of the resistors 22a to 24a are equal to each other, the adjusted reference voltage VREF2 is given as follows.

$$VREF2 = VREF + Von \quad (2)$$

Note that the adder circuit 20a corresponds to an "adder circuit" and the reference voltage VREF2 corresponds to a "first voltage".

<<Control Circuit 30a>>

The control circuit 30a causes the PMOS transistor 60 to generate a current based on the reference voltage VREF2. The control circuit 30a includes an operational amplifier 31a, an NMOS transistor 32a, a resistor 33a, a PMOS transistor 34a, and a PMOS transistor 38a.

The operational amplifier 31a has a non-inverting input terminal to which the reference voltage VREF2 is applied and an inverting input coupled to a source terminal of the NMOS transistor 32a and one end of the resistor 33a for detecting a current I1a flowing through the NMOS transistor 32a and the PMOS transistor 34a.

A current is supplied from the diode-coupled PMOS transistor 34a to the NMOS transistor 32a when the PMOS transistor 38a is off. Then, the operational amplifier 31a controls the NMOS transistor 32a such that a voltage at the inverting input terminal thereof becomes equal to the reference voltage VREF2 applied to the non-inverting input terminal thereof.

As a consequence, the current I1a determined by the reference voltage VREF2 and a resistance value of the resistor 33a flows through the diode-coupled PMOS transistor 34a.

Meanwhile, the PMOS transistor 34a and the PMOS transistor 60 configure a current mirror circuit. Accordingly, a current I2 corresponding to the current I1a that flows through the PMOS transistor 34a flows through the PMOS transistor 60.

Note that the PMOS transistor 38a is a device for switching on and off of the PMOS transistor 34a and the PMOS transistor 60 based on an output of a level shifter 42a (described later). In an embodiment of the present disclosure, when the PMOS transistor 38a is off, the PMOS transistor 34a and the PMOS transistor 60 operate, and thus the PMOS transistor 60 generates the current I2.

On the other hand, when the PMOS transistor 38a is on, the PMOS transistor 34a and the PMOS transistor 60 are off, and thus the generation of the current I2 is stopped.

Note that a ground line L2 corresponds to a "ground line" and a circuit that combines the PMOS transistor 60, the voltage detection circuit 10a, the adder circuit 20a, and the control circuit 30a corresponds to a "current generation circuit".

<<Switching Circuit 40a>>

When the drive signal Vdrx from the microcomputer (not illustrated) is, for example, at a low level (hereinafter referred to as low or low level), the switching circuit 40a operates the discharge circuit 50 to turn off the IGBT 301. Meanwhile, when the drive signal Vdrx is, for example, at a high level (hereinafter referred to as high or high level), the switching circuit 40a operates the current mirror circuit configured with the PMOS transistor 34a and the PMOS transistor 60 to turn on the IGBT 301.

The switching circuit 40a includes an inverter 41a and the level shifter 42a.

The inverter 41a inverts a logic level of the drive signal Vdrx, and outputs the inverted signal to gate terminals of NMOS transistors 51 and 52 of the discharge circuit 50 (described later).

The level shifter 42a shifts the level of the drive signal Vdrx and outputs signals to turn on and off the PMOS transistor 38a of the control circuit 30a. Specifically, when the drive signal Vdrx goes high, the PMOS transistor 38a is turned off, and thus the PMOS transistor 60 generates the current I2. On the other hand, when the drive signal Vdrx goes low, the level shifter 42a turns on the PMOS transistor 38a and pulls up a gate terminal of the PMOS transistor 34a. As a consequence, the PMOS transistor 60 stops generating the current I2.

Note that the high drive signal Vdrx corresponds to a "first signal", and the low drive signal Vdrx corresponds to a "second signal".

<<Discharge Circuit 50>>

The discharge circuit 50 is a circuit for turning off the IGBT 301 by discharging gate capacitance of the IGBT 301 when the drive signal Vdrx goes low. The discharge circuit 50 includes the NMOS transistors 51 and 52, and a switch 53.

The NMOS transistors 51 and 52 has gate terminals thereof coupled to an output of the inverter 41a of the switching circuit 40a and drain terminals thereof coupled to the terminal OUTX.

Here, the NMOS transistor 51 is large in size because a large current flows therethrough to discharge the gate capacitance of the IGBT 301. And, a wiring resistance Roff between a source terminal of the NMOS transistor 51 and the ground line L2 occurs in wiring the NMOS transistor 51 inside the integrated circuit. Further, a back-gate terminal of the NMOS transistor 51 is coupled to the ground line L2.

For this reason, the NMOS transistor 51 has a back-gate effect of raising a threshold voltage of the NMOS transistor 51. Accordingly, the gate capacitance of the IGBT 301 may not be discharged in a short time due to the wiring resistance Roff and the back-gate effect of the NMOS transistor 51.

Thus, in an embodiment of the present disclosure, the NMOS transistor 52 is provided in parallel with the NMOS transistor 51 to prevent the gate capacitance of the IGBT 301 from being unable to be discharged in a short time.

Note that the NMOS transistor 52 only needs to operate in a case where the NMOS transistor 51 is unable to discharge the gate capacitance of the IGBT 301 in a short time.

For this reason, the switch 53 is coupled between the ground line L2 and the gate terminal of the NMOS transistor 52 that assists the NMOS transistor 51 in discharging. Although details will be described later, the switch 53 is tuned off when the sum of the wiring resistance Roff and on-resistance of the NMOS transistor 51 is larger than a predetermined value.

Note that the wiring resistance Roff corresponds to "second wiring resistance", the NMOS transistor 51 corresponds to a "first NMOS transistor", and the NMOS transistor 52 corresponds to a "second NMOS transistor".

<<Method of Adjusting Variable Resistors 12a to 15a>>

Figure 5:
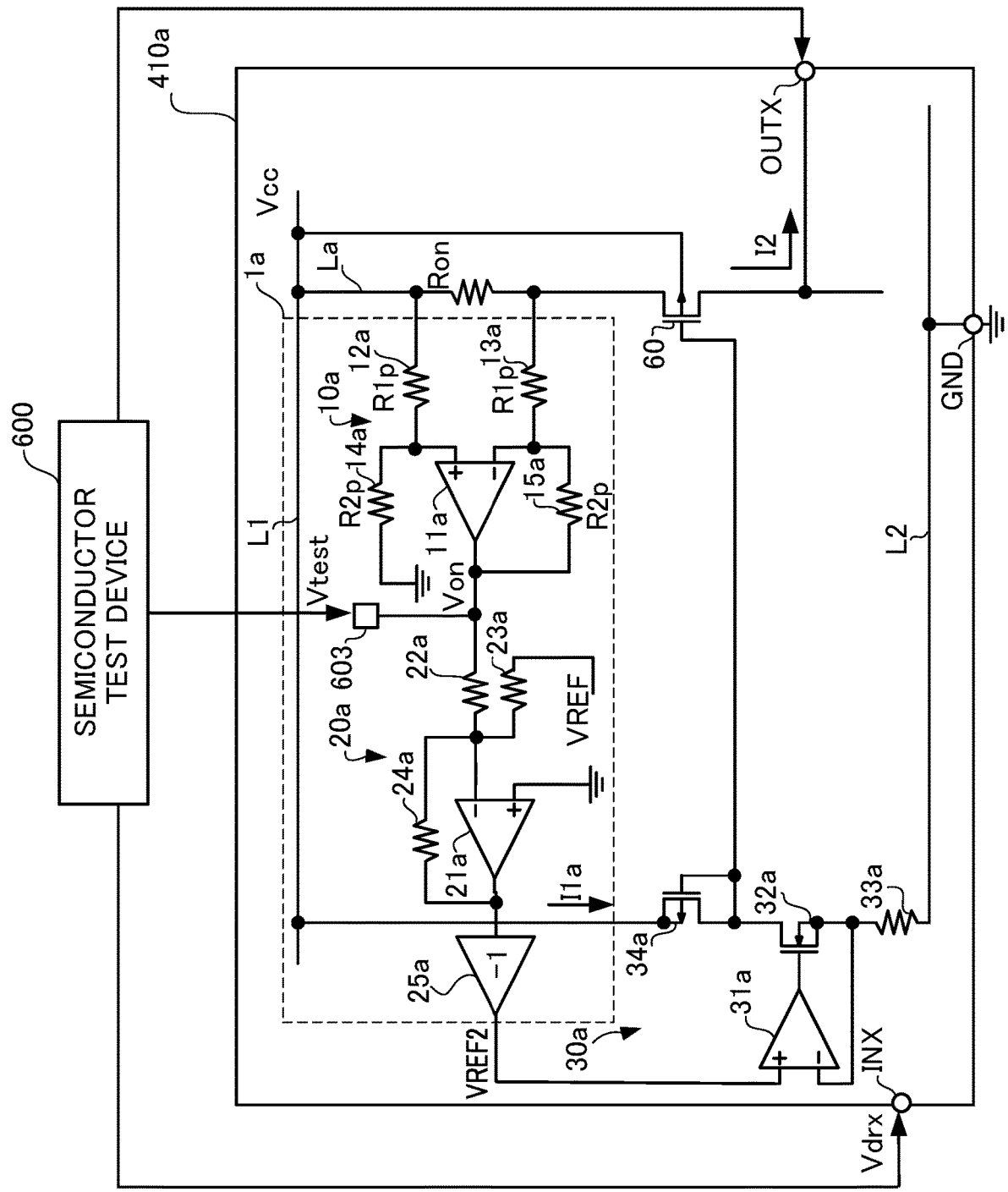
FIG. 5 is a diagram for explaining a drive circuit 410*a* at the time of adjusting variable resistors.

FIG. 5 is a diagram for explaining adjustment of the variable resistors 12a to 15a. FIG. 5 illustrates only main configuration for the convenience sake.

Figure 6:
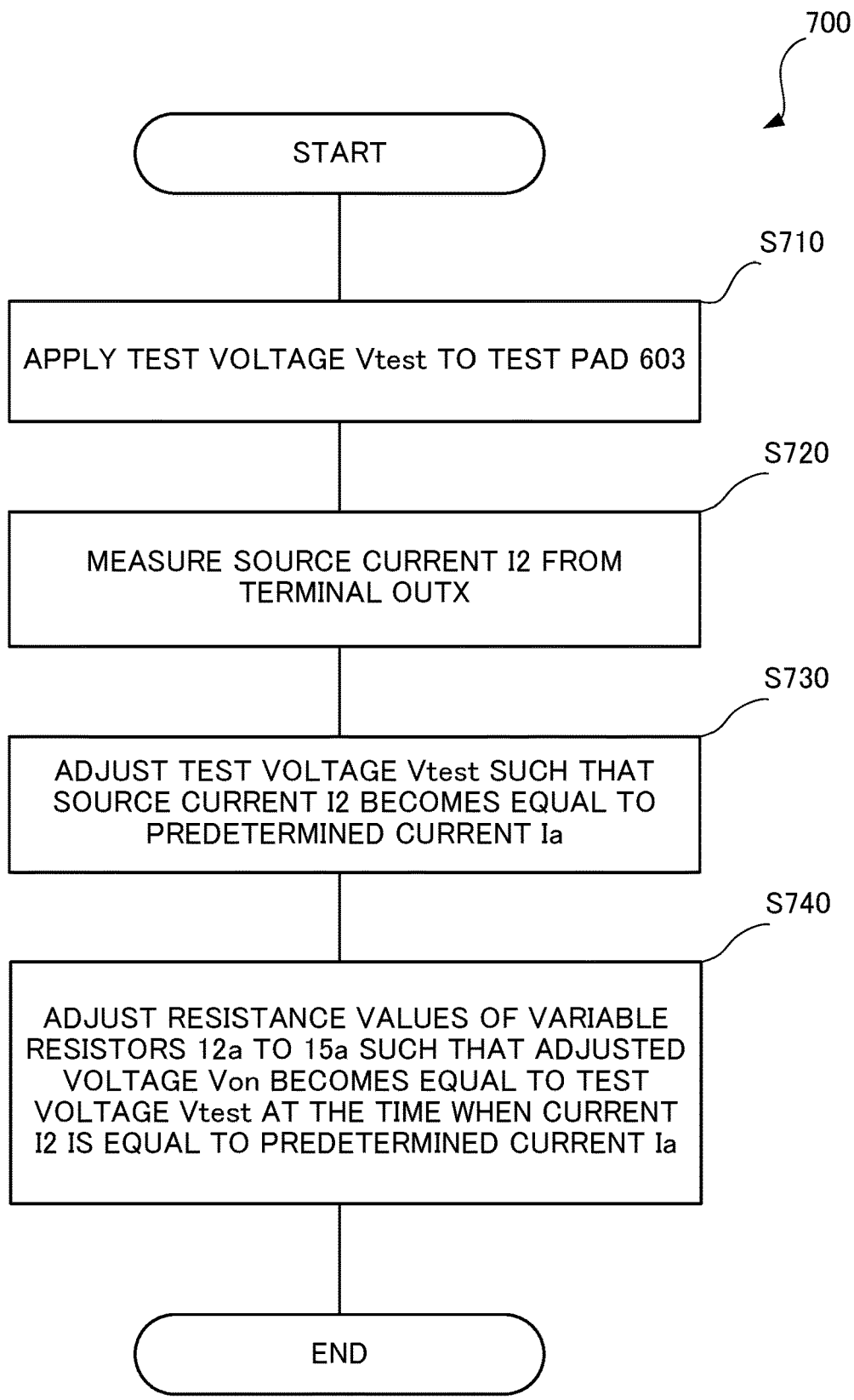
FIG. 6 is a diagram illustrating an exemplary method 700 of adjusting a variable resistor 12*a* performed by a semiconductor test device 600.

FIG. 6 is a diagram illustrating an exemplary method 700 of adjusting the variable resistors 12a to 15a performed by a semiconductor test device 600. Note that variable resistors in drive circuits 410b and 410c, which will be described later, can also be similarly adjusted.

Here, it is assumed that the variable resistors 12a to 15a are adjusted when a wafer having the LVIC 210 of the drive circuit 410a mounted thereon is tested. It is also assumed that power is supplied to the drive circuit 410a.

First, the semiconductor test device 600 applies the high drive signal Vdrx to a terminal INX and applies a test voltage Vtest to a test pad 603 located on the wiring from an output terminal of the voltage detection circuit 10a (S710). It is assumed here that a bias current from a bias current circuit (not illustrated) for operating the voltage detection circuit 10a is stopped and an operation of the voltage detection circuit 10a is thus stopped.

When the test voltage Vtest is applied, the adder circuit 20a outputs the reference voltage VREF2 that is adjusted by adding the test voltage Vtest and the reference voltage VREF. The control circuit 30a passes the current I1a corresponding to the adjusted reference voltage VREF2 and the resistance value of the resistor 33a. As a consequence, the PMOS transistor 60 passes the source current I2 corresponding to the current I1a for charging the gate capacitance of the IGBT 301.

Then, the semiconductor test device 600 measures the source current I2 corresponding to the test voltage Vtest when the source current I2 is outputted from the terminal OUTX (S720).

Further, the semiconductor test device 600 adjusts the test voltage Vtest such that the source current I2 becomes equal to a predetermined current value Ia (S730). Note that when the adjustment of the test voltage Vtest is performed, the semiconductor test device 600 activates the bias current circuit (not illustrated) that operates the voltage detection circuit 10a.

Then, the semiconductor test device 600 adjusting the resistance values of the variable resistors 12a to 15a such that the adjusted voltage Von of the voltage detection circuit 10a becomes equal to the test voltage Vtest at the time when the current I2 is equal to the predetermined current value Ia (S740).

Specifically, the semiconductor test device 600 generates data to be stored in the EPROM 560 such that the adjusted voltage Von of the voltage detection circuit 10a becomes equal to the test voltage Vtest at the time when the current I2 is equal to the predetermined current value Ia. As a consequence, the MOS transistors serving as switches in the variable resistor 12a turn on and off based on the data in the EPROM 560.

Note that the same applies to the case where the Zener diode that enables Zener zapping is employed as an element for adjusting the variable resistor 12a. The semiconductor test device 600 applies a voltage across two ends of the Zener diode and burns out the Zener diode such that the adjusted voltage Von of the voltage detection circuit 10a becomes equal to the test voltage Vtest at the time when the current I2 is equal to the predetermined current value Ia.

Alternatively, the same applies to the case where the polysilicon fuse that enables laser trimming is employed as the element for adjusting the variable resistor 12a. The semiconductor test device 600 irradiates the fuse with a laser beam and cuts the fuse such that the adjusted voltage Von of the voltage detection circuit 10a becomes equal to the test voltage Vtest at the time when the current I2 is equal to the predetermined current value Ia.

Note that S710, S720, S730, and S740 collectively correspond to a "current adjustment method". Meanwhile, S720 corresponds to a "first step", and S740 corresponds to a "second step".

An example of the method of adjusting the variable resistors 12a to 15a has been described above. There are various other similar adjustment methods, and any of those methods may be employed.

<<Method of Adjusting Switch 53>>

Figure 7:
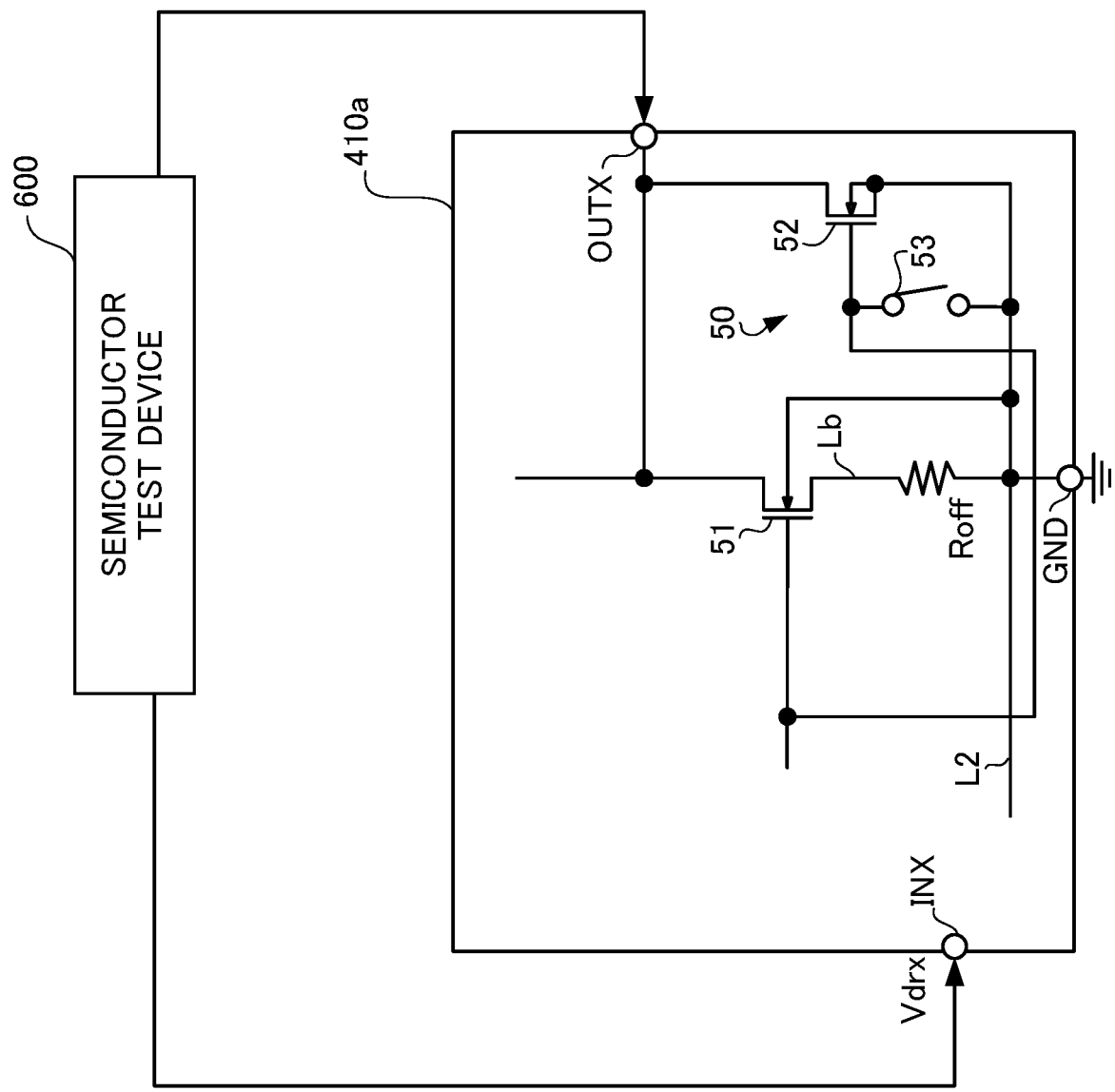
FIG. 7 is a diagram for explaining a drive circuit 410*a* at the time of adjusting a switch.
Figure 8:
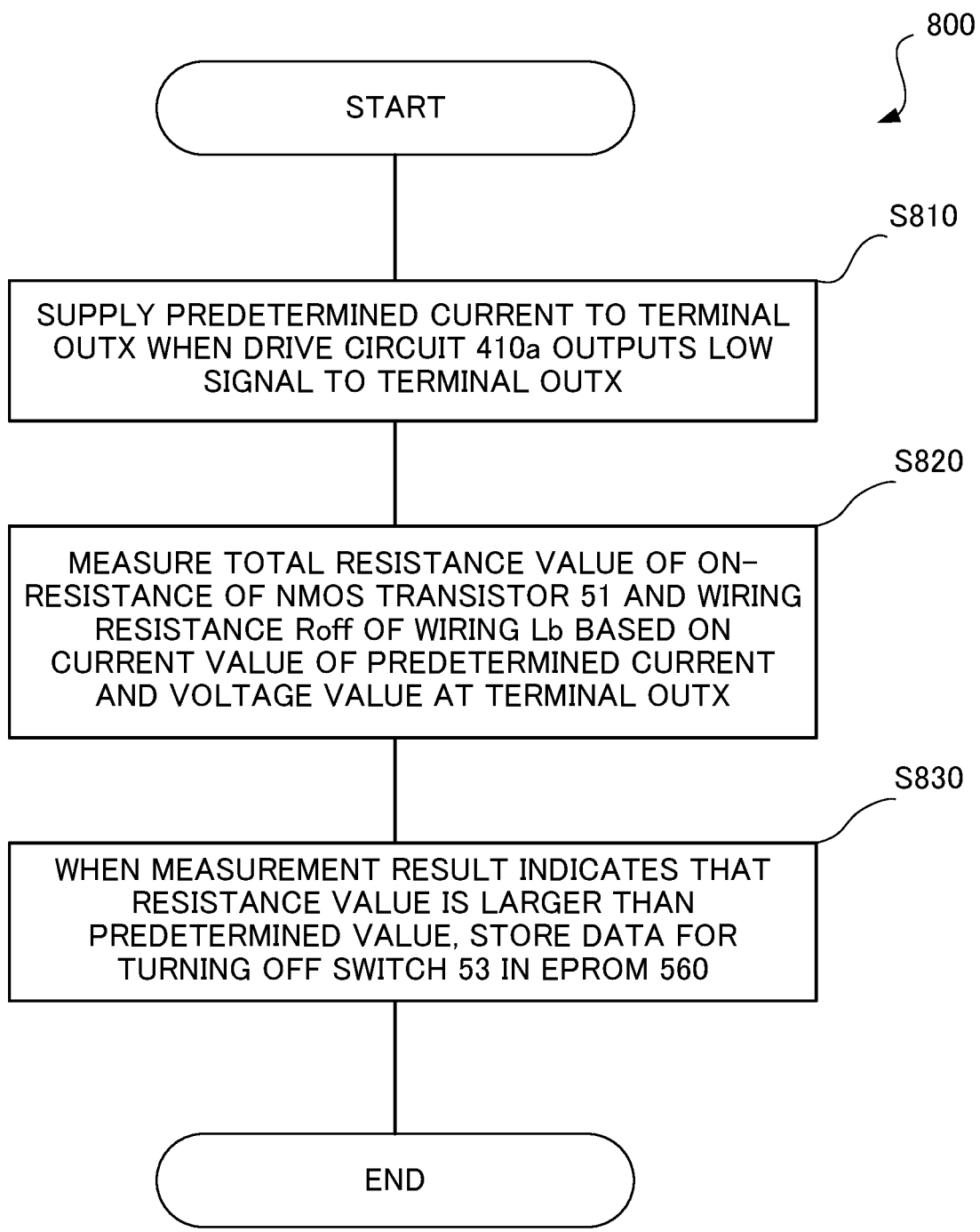
FIG. 8 is a diagram illustrating an exemplary method 800 of adjusting a switch 53.

FIG. 7 is a diagram for explaining adjustment of the switch 53. Here, only main configuration is illustrated for the convenience sake. FIG. 8 is a diagram illustrating an exemplary method 800 of adjusting the switch 53.

It is assumed here that the semiconductor test device 600 adjusts the switch 53 in a state of supplying power to the drive circuit 410a.

First, the semiconductor test device 600 supplies a predetermined current to the terminal OUTX when the drive circuit 410a outputs the low signal to the terminal OUTX (S810). Here, the "predetermined current" indicates a current having a constant current value (such as 1 A).

Meanwhile, the semiconductor test device 600 measures a total resistance value of the on-resistance of the NMOS transistor 51 and the wiring resistance Roff of wiring Lb based on the current value of the predetermined current and the voltage value at the terminal OUTX (S820).

When a measurement result indicates that the resistance value is larger than a predetermined value, the semiconductor test device 600 stores data for turning off the switch 53 in the EPROM 560 (S830).

As a consequence, when the NMOS transistor 51 is on, the NMOS transistor 52 is also on. Accordingly, the discharge circuit 50 can avoid an increase in a period of time for discharging the gate capacitance of the IGBT 301.

Note that as with the case of the variable resistor 12a, the switch 53 can be implemented using another element such as the Zener diode that enables Zener zapping, the polysilicon fuse, or the like.

<<Operation of Drive Circuit 410a>>

Next, an operation of the drive circuit 410a will be described. It is assumed here that the variable resistors 12a to 15a of the drive circuit 410a in FIG. 3 have been adjusted by performing the processes in FIG. 6 and the switch 53 is turned off by performing the processes in FIG. 8.

When the drive signal Vdrx in the drive circuit 410a goes high, the inverter 41a of the switching circuit 40a applies the low signal to the gate terminals of the NMOS transistors 51 and 52. As a consequence, the NMOS transistors 51 and 52 are turned off.

Meanwhile, the level shifter 42a causes the gate terminal of the PMOS transistor 38a to be high, and thus the PMOS transistor 38a is turned off. As a consequence, the gate terminal of the PMOS transistor 34a is not pulled up and the current mirror circuit that is configured with the PMOS transistors 34a and 60 operates.

Here, the voltage detection circuit 10a generates the adjusted voltage Von corresponding to the resistance value of the wiring resistance Ron of the wiring La. Then, the adder circuit 20a generates the adjusted reference voltage VREF2 by adding the adjusted voltage Von and the reference voltage VREF.

The operational amplifier 31a of the control circuit 30a adjusts an output voltage thereof so as to pass the current I1a based on the adjusted reference voltage VREF2 and the resistor 33a.

As a consequence, the PMOS transistor 60 generates the predetermined current value Ia for charging the gate capacitance of the IGBT 301 irrespective of the resistance value of the wiring resistance Ron of the wiring La.

On the other hand, when the drive signal Vdrx goes low, the level shifter 42a causes the gate terminal of the PMOS transistor 38a to be low, and thus the PMOS transistor 38a is turned on. As a consequence, the gate electrode of the PMOS transistor 34a is pulled up and the PMOS transistor 60 is turned off.

Meanwhile, the inverter 41a of the switching circuit 40a applies the high signal to the gate terminals of the NMOS transistors 51 and 52. Accordingly, the NMOS transistors 51 and 52 are turned on.

As a consequence, the NMOS transistors 51 and 52 discharge the gate capacitance of the IGBT 301.

<<Output Currents of Respective Phases when Using Drive Circuits 410a for Drive Circuits 410, 420, and 430, Respectively>>

Figure 9:
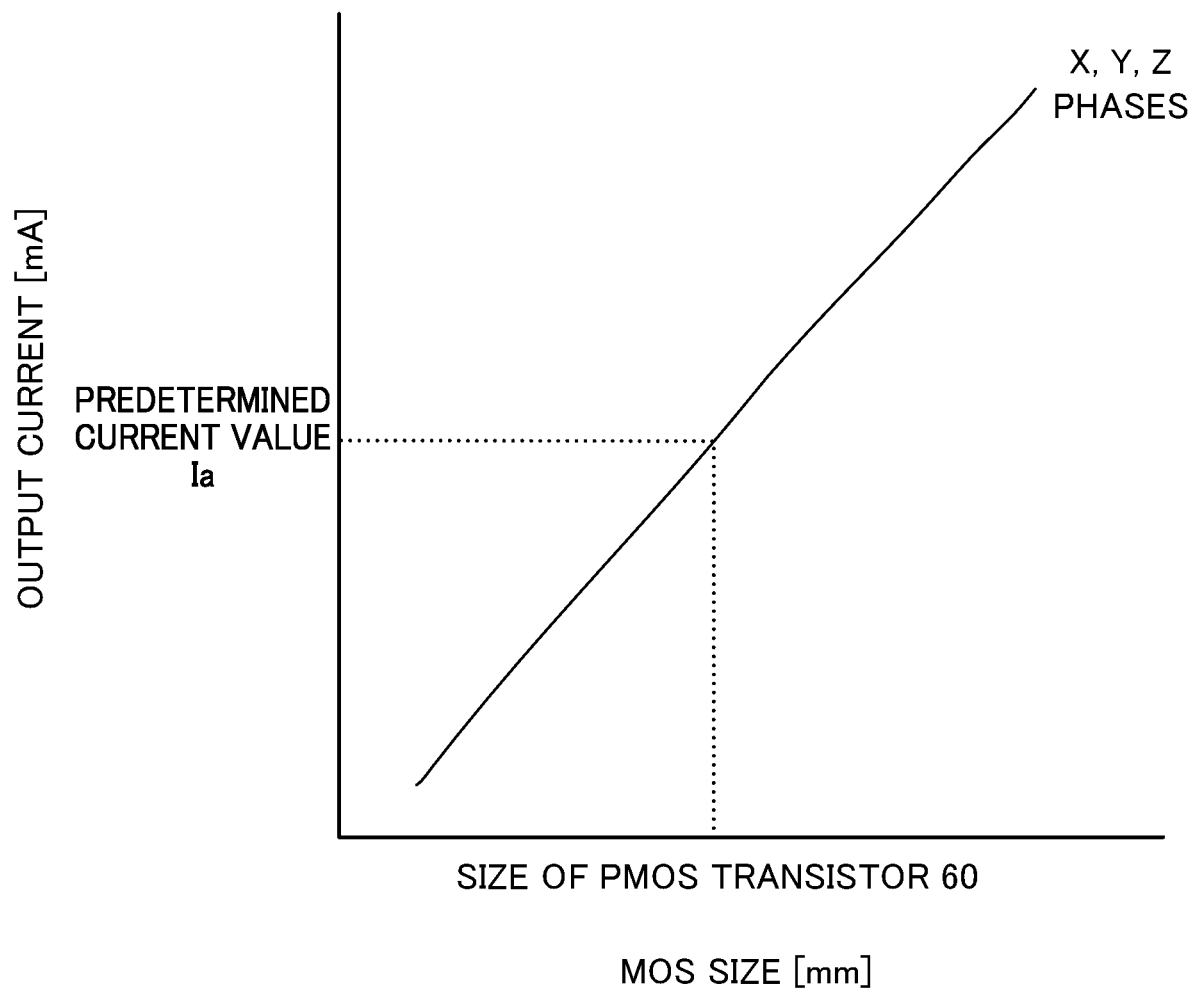
FIG. 9 is a graph plotting output currents of phases in a case of using a drive circuit 410*a* for each of drive circuits 410, 420, and 430.

FIG. 9 is a graph plotting output currents of respective phases in a case of using the drive circuits 410a for the drive circuits 410, 420, and 430, respectively, in FIG. 2. Note that the case of using the drive circuits 410a for the drive circuits 410, 420, and 430, respectively, indicates a case of employing the drive circuit 410a as the drive circuit 410, employing another drive circuit 410a as the drive circuit 420, and employing still another drive circuit 410a as the drive circuit 430.

In the case of using the drive circuits 410a for of the drive circuits 410, 420, and 430, respectively, the wiring resistances Ron on the source side of the respective PMOS transistors 60 in the drive circuits 410, 420, and 430 significantly vary. However, in the drive circuits 410, 420, and 430 according to an embodiment of the present disclosure, for example, the adjustment method given in FIG. 6 is carried out.

As a consequence, the influence of the wiring resistance Ron is reduced, thereby being able to cause the output currents from the drive circuits 410, 420, and 430 to be the predetermined current value Ia.

Note that the predetermined current value Ia is the value of the current to be outputted when the PMOS transistor 60 has a predetermined size. Thus, even in the case of changing the size of the PMOS transistor 60, it is still possible to pass the current at the predetermined current value Ia corresponding to the size of the PMOS transistor 60 by carrying out the adjustment method illustrated in FIG. 6, for example.

Accordingly, in the case of using the power module 100 that employs the drive circuits 410a for the drive circuits 410, 420, and 430, respectively, the currents of the three phases on the lower arm side can be made equal to one another with high accuracy, for example.

<<Configuration of Drive Circuit 415>>

Figure 10:
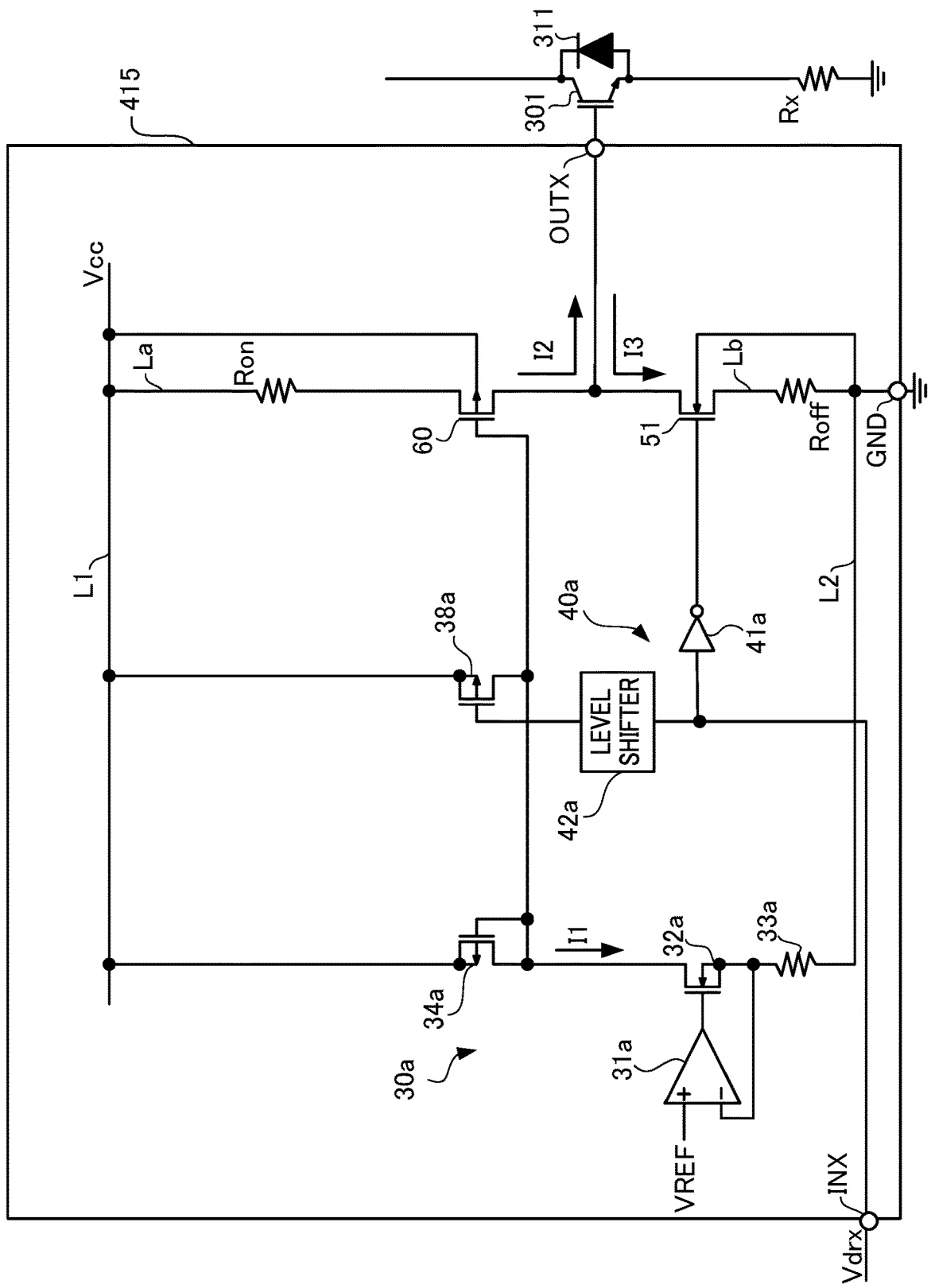
FIG. 10 is a diagram illustrating an example of a configuration of a drive circuit 415.

FIG. 10 is a diagram illustrating a configuration of a common drive circuit 415. The drive circuit 415 determines a current value of a source current to drive the IGBT 301 based on the reference voltage VREF. The drive circuit 415 includes the control circuit 30a, the switching circuit 40a, the PMOS transistor 60, and the NMOS transistor 51.

The configurations of the control circuit 30a and the switching circuit 40a are similar to those in the drive circuit 410a and explanations thereof are omitted. In addition, the operation of the NMOS transistor 51 is similar to that of the drive circuit 410a.

The source current supplied to the IGBT 301 by the PMOS transistor 60 is determined solely by a voltage value of the reference voltage VREF. In such a case, the source current of the PMOS transistor 60 is influenced by the resistance value of the wiring resistance Ron of the wiring La.

<<Output Currents of Respective Phases when Using Drive Circuits 415 for Drive Circuits 410, 420, and 430, Respectively, in FIG. 2>>

Figure 11:
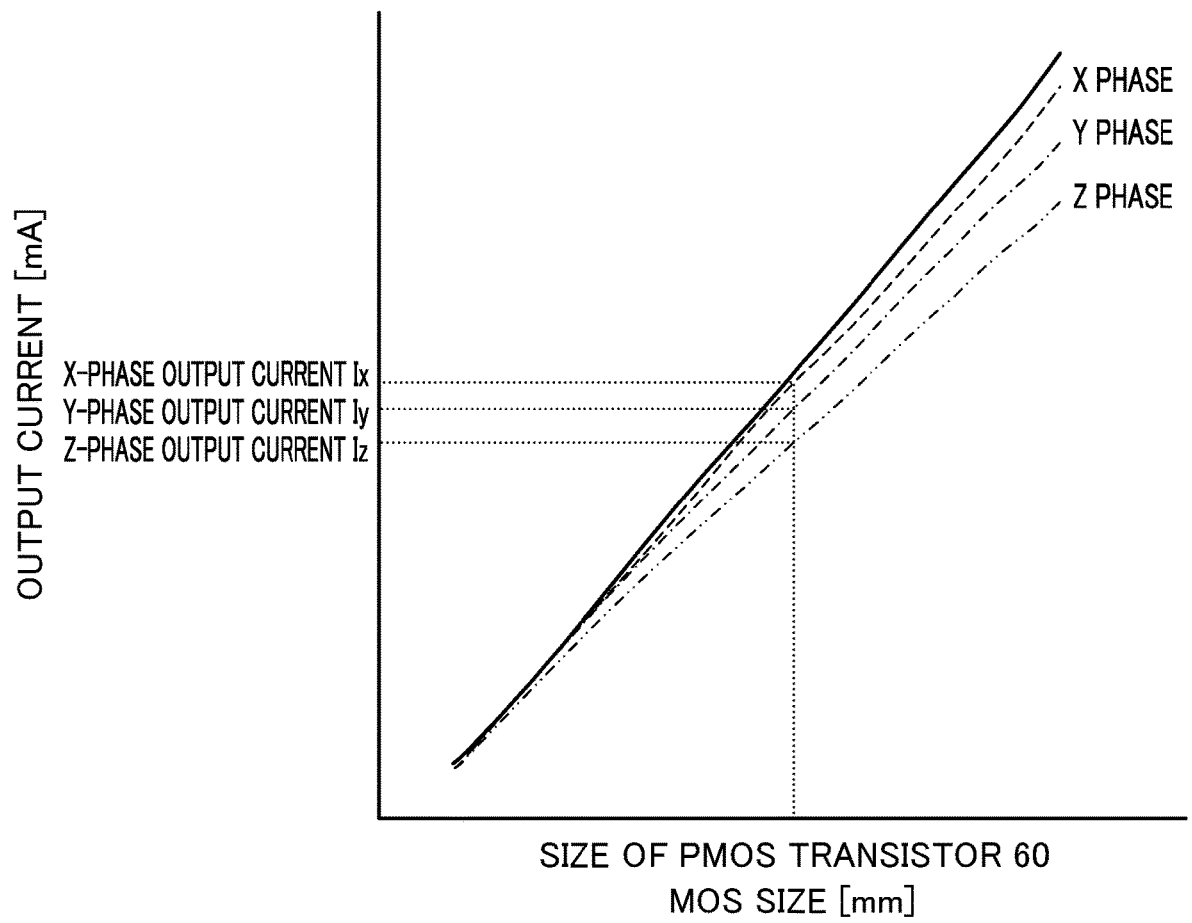
FIG. 11 is a graph plotting output currents of respective phases from a drive circuits 415.

FIG. 11 is a graph plotting output currents of the respective phases in a case of using the drive circuits 415 for the drive circuits 410, 420, and 430, respectively, in FIG. 2. Note that the case of using the drive circuits 415 for the drive circuits 410, 420, and 430, respectively, indicates a case of employing the drive circuit 415 as the drive circuit 410, employing another drive circuit 415 as the drive circuit 420, and employing still another drive circuit 415 as the drive circuit 430.

The drive circuit 415 drives the IGBT 301 with a current at the current value of the source current which is determined solely by the value of the reference voltage VREF. Thus, each of the drive circuits 410, 420, and 430 is influenced by the resistance value of the wiring resistance Ron of the wiring La. As a consequence, the output currents from the respective drive circuits 410, 420, and 430 deviate from the predetermined current value Ia.

Accordingly, in the case of using the power module 100 that employs the common drive circuits 415 as the drive circuits 410, 420, and 430, respectively, it is difficult to make the currents of the three phases on the lower arm side equal to one another with high accuracy, for example.

<<Configuration of Drive Circuit 410b>>

Figure 12:
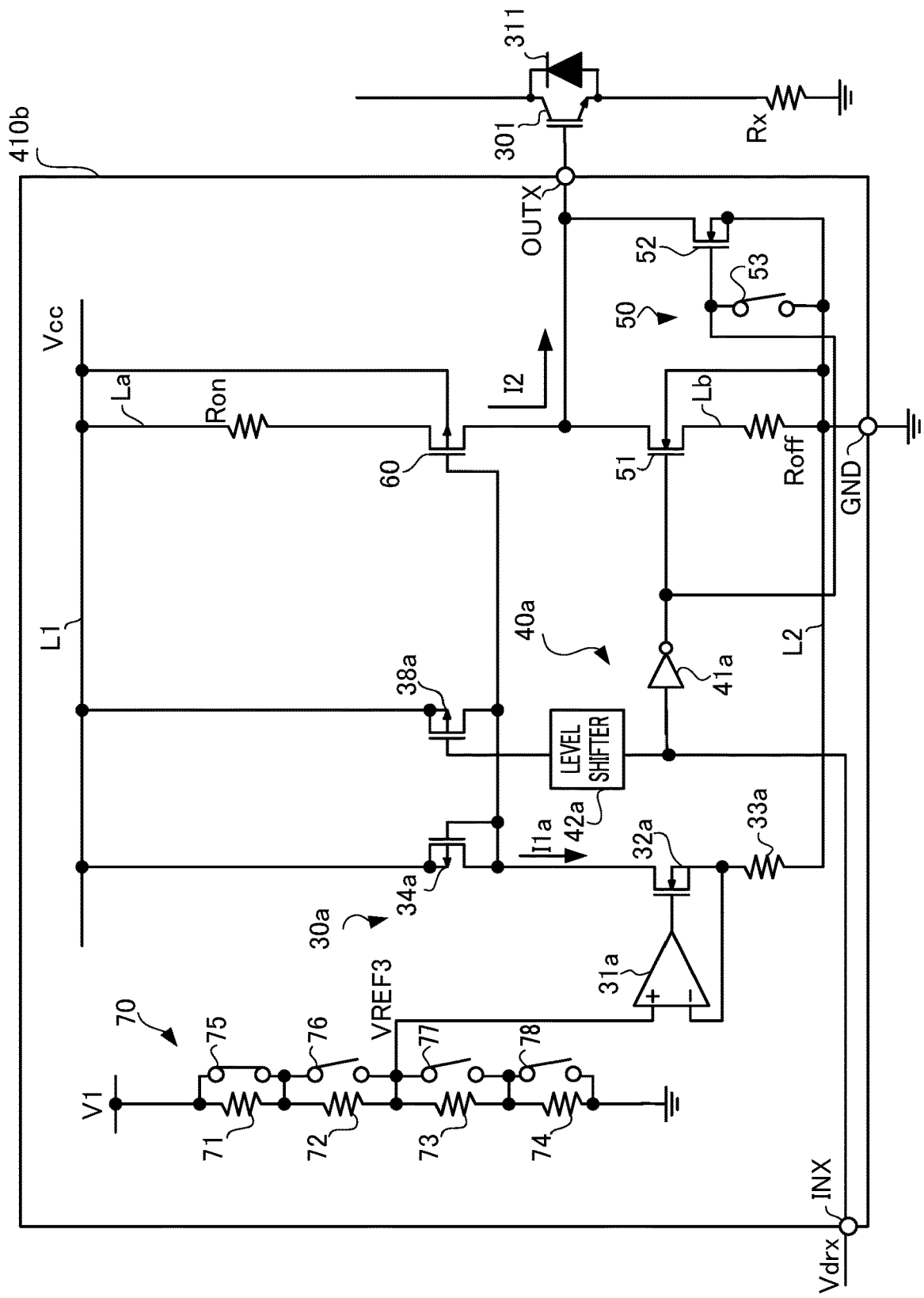
FIG. 12 is a diagram illustrating an example of a configuration of a drive circuit 410*b*.

FIG. 12 is a diagram illustrating an example of a configuration of the drive circuit 410b, which is one embodiment of the drive circuit 410. The drive circuit 410b includes the control circuit 30a, the switching circuit 40a, the discharge circuit 50, the PMOS transistor 60, and a voltage divider circuit 70.

The control circuit 30a, the switching circuit 40a, the discharge circuit 50, and the PMOS transistor 60 are similar to those in the drive circuit 410a, and thus explanations thereof are omitted.

<<Voltage Divider Circuit 70>>

The voltage divider circuit 70 generates an adjusted reference voltage VREF3 by dividing a predetermined voltage V1. The voltage divider circuit 70 includes resistors 71, 72, 73, and 74 (hereinafter referred to as "resistors 71 to 74"), and switches 75, 76, 77, and 78 (hereinafter referred to as "switches 75 to 78").

The resistors 71 to 74 are coupled in series between one end to which the predetermined voltage V1 is applied and the other end that is grounded. The switches 75 to 78 are coupled in parallel with the resistors 71 to 74, respectively.

Here, the switches in the voltage divider circuit 70 can be adjusted, for example, by a method similar to the above-described method in FIG. 6. Specifically, the semiconductor test device 600 adjusts the switches 75 to 78 so as to generate the reference voltage VREF3 that brings the current I2 of the PMOS transistor 60 to be equal to the predetermined current value Ia.

As a consequence, the drive circuit 410b can charge the gate capacitance of the IGBT 301 with the current at the predetermined current value Ia, irrespective of the magnitude of the wiring resistance Ron on the source side of the PMOS transistor 60.

Note that the drive circuits 410b may be used for the drive circuits 410, 420, and 430, respectively, in FIG. 2, similarly to the drive circuit 410a. In such a case, the output currents of the respective phases can be made equal to one another with high accuracy.

Note that the voltage divider circuit 70 corresponds to the "variable resistor circuit" and the adjusted reference voltage VREF3 corresponds to the "first voltage". Further, the predetermined voltage V1 corresponds to a "predetermined voltage" and a node for supplying the adjusted reference voltage VREF3 corresponds to a "predetermined node".

<<Another Configuration of Discharge Circuit>>

Figure 13:
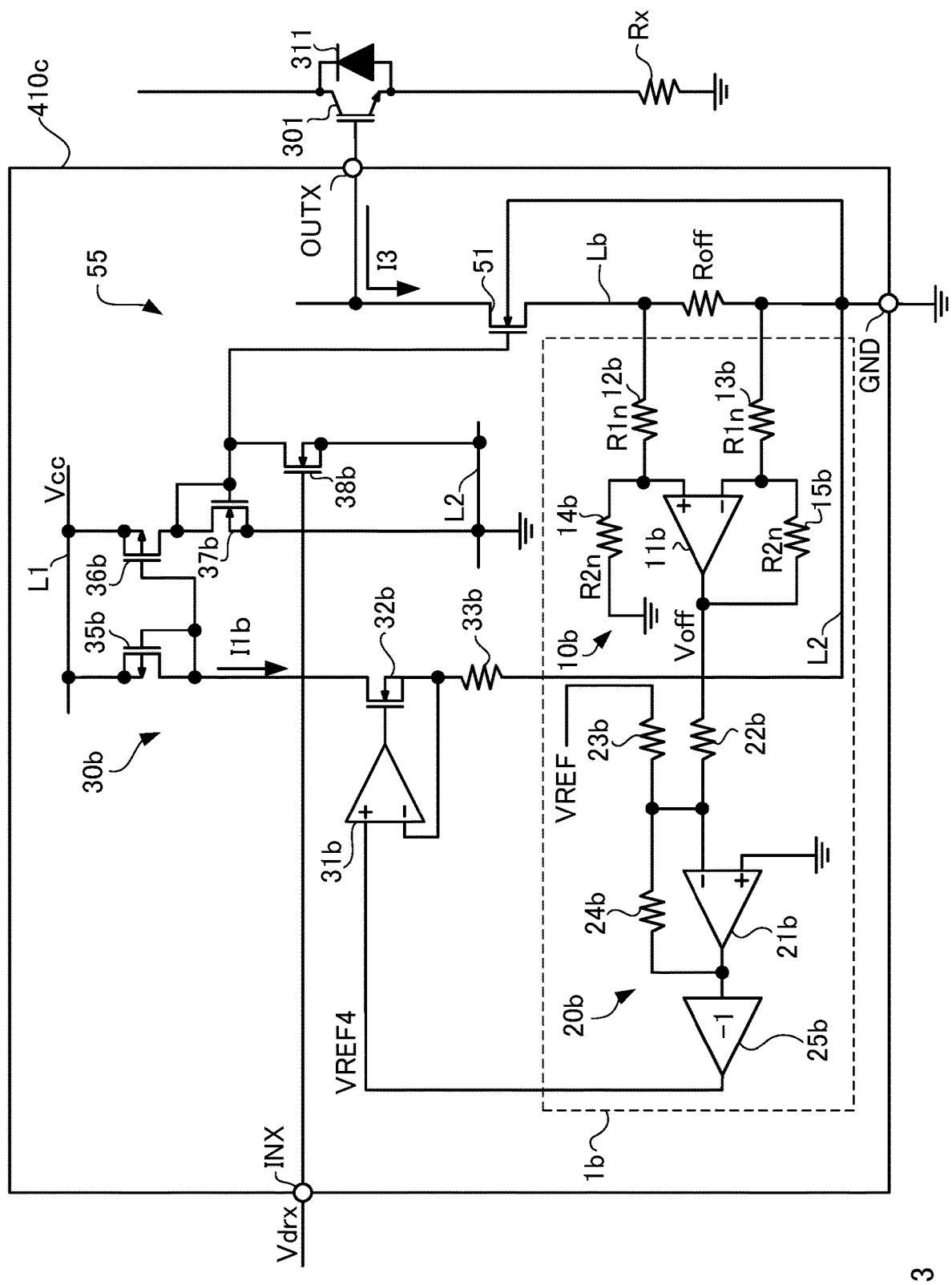
FIG. 13 is a diagram illustrating an embodiment of a discharge circuit 55 that is used in place of a discharge circuit 50.

FIG. 13 is a diagram illustrating an embodiment of a discharge circuit 55 to be used in place of the discharge circuit 50.

The discharge circuit 55 discharges the gate capacitance of the IGBT 301 with a predetermined current I3. The discharge circuit 55 includes a voltage generation circuit 1b including a voltage detection circuit 10b and an adder circuit 20b, a control circuit 30b, a switching circuit 40b, and the NMOS transistor 51.

<<Voltage Generation Circuit 1b>>

The voltage generation circuit 1b generates an adjusted reference voltage VREF4 corresponding to a resistance value of wiring between the ground line L2 and the source terminal of the NMOS transistor 51.

<<Voltage Detection Circuit 10b>>

The voltage detection circuit 10b generates an adjusted voltage Voff corresponding to a resistance value of the wiring resistance Roff of the wiring Lb between the ground line L2 and the source terminal of the NMOS transistor 51. The voltage detection circuit 10b includes an operational amplifier 11b, and variable resistors 12b, 13b, 14b, and 15b (hereinafter, referred to as "variable resistors 12b to 15b").

Note that a configuration of the voltage detection circuit 10b is the same as the configuration of the voltage detection circuit 10a, and thus an explanation thereof is omitted. Note that the variable resistors 12b to 15b are adjusted similarly to the variable resistor 12a.

<<Adder Circuit 20b>>

The adder circuit 20b outputs the voltage obtained by adding the adjusted voltage Voff and the reference voltage VREF as the adjusted reference voltage VREF4. The adder circuit 20b includes an operational amplifier 21b, resistors 22b, 23b, and 24b, and an inverting amplifier 25b.

Note that a configuration of the adder circuit 20b is similar to the configuration of the adder circuit 20a, and an explanation thereof is omitted.

<<Control Circuit 30b>>

The control circuit 30b causes the NMOS transistor 51 to generate a current based on the adjusted reference voltage VREF4. The control circuit 30b includes an operational amplifier 31b, an NMOS transistor 32b, a resistor 33b, PMOS transistors 35b and 36b, and an NMOS transistor 37b.

The operational amplifier 31b has a non-inverting input terminal to which the adjusted reference voltage VREF4 is applied, and an inverting input terminal coupled to one end of the resistor 33b and a source terminal of the NMOS transistor 32b, the resistor 33b detecting a current I1b that flows through the NMOS transistor 32b and the PMOS transistor 35b. The other end of the resistor 33b is coupled to the ground line L2.

A current is supplied from the diode-coupled PMOS transistor 35b to the NMOS transistor 32b. Then, the operational amplifier 31b controls the NMOS transistor 32b such that a voltage at the inverting input terminal thereof becomes equal to the reference voltage VREF4 that is applied to the non-inverting input terminal thereof.

As a consequence, the current I1b determined by the reference voltage VREF4 and a resistance value of the resistor 33b flows through the diode-coupled PMOS transistor 35b.

Meanwhile, the PMOS transistors 35b and 36b configure a current mirror circuit, and thus a current corresponding to the current I1b flows through the diode-coupled NMOS transistor 37b. The NMOS transistor 37b and the NMOS transistor 51 also configure a current mirror circuit. Accordingly, the NMOS transistor 51 generates the current I3 corresponding to the current I1b when an NMOS transistor 38b is off.

Note that the NMOS transistor 38b is a device for switching on and off of the NMOS transistor 37b and the NMOS transistor 51 in response to the drive signal Vdrx. In an embodiment of the present disclosure, the NMOS transistor 51 generates the current I3 corresponding to the current I1*b* when the NMOS transistor 38*b* is off.

On the other hand, when the NMOS transistor 38*b* is on, the NMOS transistor 51 is off, and thus the generation of the current I3 is stopped.

Here, the variable resistors 12*b* to 15*b* in the discharge circuit 55 are adjusted by the above-described method in FIG. 6. As a consequence, the discharge circuit 55 can discharge the gate capacitance of the IGBT 301 with a current at a predetermined current value, irrespective of the magnitude of the wiring resistance Roff.

Meanwhile, when the discharge circuit 55 as such is used for each of the drive circuits 410, 420, and 430, sink currents of the three phases on the lower arm side of the power module 100 result in being equal to one another with high accuracy.

Other Embodiments

The voltage detection circuit 10*a* and the voltage divider circuit 70 according to an embodiment of the present disclosure each generate the reference voltage by adjusting the resistance values of the variable resistors. However, the voltage detection circuit 10*a* and the voltage divider circuit 70 may each generate a desired voltage (for example, the adjusted voltage Von and the reference voltage VREF2) by using another method.

For example, such a desired voltage may be generated by using an analog-digital converter configured to generate an analog voltage that is based on a digital value stored in the EPROM. In such a case, the analog-digital converter corresponds to the "voltage generation circuit".

Summary

The power module 100 according to an embodiment of the present disclosure has been described above. In general, in the LVIC 210 having the multiple drive circuits 410, 420, and 430 integrated therein of the power module 100, the wiring resistances Ron and Roff of the wiring La and Lb in the drive circuits vary with arrangements of the drive circuits. As a consequence, the output currents of the drive circuits 410, 420, and 430 influenced by the resistance value of the wiring resistance Ron could not be brought close to a target value. However, for example, the drive circuit 410*a* according to an embodiment of the present disclosure adjusts a variation in the output currents caused by the wiring resistances Ron and Roff. This makes it possible to reduce the influence of the wiring resistances Ron and Roff, thereby being able to bring the output current of the drive circuit 410*a* close to the target value.

Further, the output current of the drive circuit 410*a* can be brought close to the target value, by causing the PMOS transistor 60 and the NMOS transistor 51 to generate currents corresponding to the wiring resistance Ron of the wiring La and the wiring resistance Roff of the wiring Lb.

Further, the output current of the drive circuit 410*a* can be linearly fine-tuned by using the voltage detection circuit 10*a* that generates the adjusted voltage Von corresponding to the resistance value of the wiring resistance Ron of the wiring La and using the adder circuit 20*a*, thereby being able to reduce the influence of the resistance value of the wiring resistance Ron. Meanwhile, if the target value of the output current of the drive circuit 410*a* needs to be changed, it may be difficult to bring the output current close to the target value based only on the adjusted voltage Von. However, in an embodiment of the present disclosure, the output current can be changed based on the reference voltage VREF and the adjusted voltage Von. This makes it possible to adjust the value of the output current easily even in the case of significantly changing the target value of the output current.

Further, it is possible to manufacture the drive circuit 410*b* capable of reducing the influence of the resistance value of the wiring resistance Ron with a small circuit scale, by generating the adjusted reference voltage VREF3 using the voltage divider circuit 70.

Further, the voltage detection circuit 10*a*, the adder circuit 20*a*, and the control circuit 30*a* of the drive circuit 410*a* can also be applied for causing the NMOS transistor 51 to generate a current as in the voltage detection circuit 10*b*, the adder circuit 20*b*, and the control circuit 30*b* of the drive circuit 410*c*.

Further, even in the case of using the drive circuits 410*a* for the three (n pieces of) drive circuits 410, 420, and 430, respectively, the output currents of the respective drive circuits 410, 420, and 430 can be brought close to the target value.

Further, it is also possible to implement a circuit that combines a circuit that causes the PMOS transistor 60 to generate the source current of the IGBT 301 and a circuit that causes the NMOS transistors 51 and 52 to discharge the gate capacitance of the IGBT 301. Moreover, this circuit can reduce a scale of the circuit that discharges the gate capacitance of the IGBT 301.

Further, the source current flowing through the terminal OUTX is measured and the resistance values of the variable resistors are adjusted, thereby being able to perform adjustment so as to bring the source current flowing through the terminal OUTX of the drive circuit 410*a* close to the target value.

According to the present disclosure, it is possible to provide a current generation circuit capable of generating a current with high accuracy.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A current generation circuit comprising:
a metal-oxide-semiconductor (MOS) transistor having a source terminal coupled to one line of a power supply line and a ground line;
a voltage generation circuit configured to generate a first voltage corresponding to a resistance value of wiring between the one line and the source terminal; and
a control circuit configured to cause the MOS transistor to generate a predetermined current based on the first voltage, wherein
the voltage generation circuit includes
a variable resistor circuit having a resistance value corresponding to the resistance value of the wiring,
a voltage output circuit configured to output a second voltage corresponding to the resistance value of the variable resistor circuit, and
an adder circuit configured to output, as the first voltage, a voltage obtained by adding the second voltage and a reference voltage.

2. The current generation circuit according to claim 1, wherein
the MOS transistor is a p-type metal-oxide-semiconductor (PMOS) transistor, and the source terminal thereof is coupled to the power supply line.

3. The current generation circuit according to claim 1, wherein
the MOS transistor is an n-type metal-oxide-semiconductor (NMOS) transistor, and the source terminal thereof is coupled to the ground line.

4. A current generation circuit comprising:
a plurality of metal-oxide-semiconductor (MOS) transistors each having a source terminal, the source terminal being coupled to one line of a power supply line and a ground line;
a voltage generation circuit configured to generate a plurality of first voltages respectively corresponding to the plurality of MOS transistors, each first voltage corresponding to a resistance value of wiring between the one line and the source terminal of one of the MOS transistors corresponding to said each first voltage; and
a control circuit configured to cause each of the plurality of MOS transistors to generate a predetermined current based on one of the first voltages corresponding to said each MOS transistor, wherein
the voltage generation circuit includes
a variable resistor circuit having a resistance value corresponding to the resistance value of the wiring,
a voltage output circuit configured to output a second voltage corresponding to the resistance value of the variable resistor circuit, and
an adder circuit configured to output, as the first voltage, a voltage obtained by adding the second voltage and a reference voltage.

5. A drive circuit configured to turn on a switching device in response to a first signal and to turn off the switching device in response to a second signal, the drive circuit comprising:
the current generation circuit of claim 1, wherein
the MOS transistor is a p-type metal-oxide-semiconductor (PMOS) transistor, and the source terminal thereof is coupled to the power supply line; and
the control circuit is configured to cause the PMOS transistor to generate the predetermined current for charging a gate capacitance of the switching device based on the first voltage, upon receiving the first signal; and
a first n-type metal-oxide-semiconductor (NMOS) transistor having a source terminal coupled to the ground line, the first NMOS transistor being configured to be turned on in response to the second signal to discharge the gate capacitance of the switching device.

6. A current generation circuit, comprising:
a metal-oxide-semiconductor (MOS) transistor having a source terminal coupled to one line of a power supply line and a ground line;
a voltage generation circuit configured to generate a first voltage corresponding to a resistance value of wiring between the one line and the source terminal; and
a control circuit configured to cause the MOS transistor to generate a predetermined current based on the first voltage, wherein
the voltage generation circuit includes a variable resistor circuit having a resistance value corresponding to the resistance value of the wiring, and
the first voltage is generated at a predetermined node in the variable resistor circuit upon application of a predetermined voltage to the variable resistor circuit.

7. The current generation circuit according to claim 6, wherein
the MOS transistor is a p-type metal-oxide-semiconductor (PMOS) transistor, and the source terminal thereof is coupled to the power supply line.

8. The current generation circuit according to claim 6, wherein
the MOS transistor is an n-type metal-oxide-semiconductor (NMOS) transistor, and the source terminal thereof is coupled to the ground line.

9. The drive circuit according to claim 5, further comprising:
a second NMOS transistor coupled in parallel with the first NMOS transistor, the second NMOS transistor being configured to be turned on in response to the second signal to discharge the gate capacitance of the switching device.

10. A current adjustment method to be performed on a current generation circuit that includes
a metal-oxide-semiconductor (MOS) transistor having a source terminal coupled to one line of a power supply line and a ground line,
a voltage generation circuit configured to generate a voltage corresponding to a resistance value of wiring between the one line and the source terminal based on a resistance value of a variable resistor circuit, and
a control circuit configured to cause the MOS transistor to generate a current based on the voltage of the voltage generation circuit,
the current adjustment method comprising:
a first step of measuring the current generated by the MOS transistor; and
a second step of adjusting the resistance value of the variable resistor circuit, such that the current generated by the MOS transistor becomes equal to a predetermined current.

* * * * *